(12) United States Patent
Asano et al.

(10) Patent No.: US 7,358,788 B2
(45) Date of Patent: Apr. 15, 2008

(54) COMPOUND SEMICONDUCTOR SWITCHING CIRCUIT DEVICE

(75) Inventors: Tetsuro Asano, Ora-gun (JP); Yuichi Kusaka, Gunma (JP); Mikito Sakakibara, Saitama (JP); Hidetoshi Ishihara, Tokyo (JP)

(73) Assignee: Sanyo Electric Co., Ltd., Osaka (JP)

( * ) Notice: Subject to any disclaimer, the term of this patent is extended or adjusted under 35 U.S.C. 154(b) by 91 days.

(21) Appl. No.: 11/412,077

(22) Filed: Apr. 27, 2006

(65) Prior Publication Data

US 2006/0252651 A1 Nov. 9, 2006

(30) Foreign Application Priority Data

Apr. 28, 2005 (JP) ............................. 2005-130766

(51) Int. Cl.
*H03K 5/08* (2006.01)
(52) U.S. Cl. .................... 327/313; 327/309; 327/109
(58) Field of Classification Search ............... None
See application file for complete search history.

(56) References Cited

U.S. PATENT DOCUMENTS

| 5,319,258 | A | * | 6/1994 | Ruetz | 326/21 |
| 5,461,533 | A | * | 10/1995 | Yoshida et al. | 361/112 |
| 5,644,283 | A | * | 7/1997 | Grosse-Wilde et al. | 338/20 |
| 5,764,075 | A | * | 6/1998 | Fukushima | 326/38 |
| 6,184,754 | B1 | * | 2/2001 | Kaneko | 331/57 |
| 6,356,102 | B1 | * | 3/2002 | Klein et al. | 326/27 |
| 6,597,237 | B2 | * | 7/2003 | Yoshimura | 327/541 |
| 7,042,270 | B2 | * | 5/2006 | Fujikawa | 327/333 |
| 2004/0222469 | A1 | * | 11/2004 | Asano et al. | 257/335 |
| 2006/0136359 | A1 | * | 6/2006 | Wilt et al. | 707/1 |

FOREIGN PATENT DOCUMENTS

| JP | 2-162744 | 6/1990 |
| WO | WO-97/45877 | 4/1997 |

OTHER PUBLICATIONS

Miyawaki, Yasuo et al. (1986) "Ion-Implanted Low Noise Dual-Gate GaAs MESFET," Sanyo Technical Review 18(2), pp. 76-84.

\* cited by examiner

*Primary Examiner*—N. Drew Richards
*Assistant Examiner*—An T. Luu
(74) *Attorney, Agent, or Firm*—Morrison & Foerster LLP

(57) ABSTRACT

Protecting elements are respectively connected between a control terminal Ctl and a ground terminal GND of a logic circuit L, between a point Cp and a ground terminal GND, and between a power supply terminal $V_{DD}$ and a ground terminal GND thereof. With this, an E-FET, constituting an inverter 70, and capacitors Ci and Cr can be protected from electrostatic breakdown due to external static electricity. Since the protecting element can be constituted by requisite components for the logic circuit, an additional step or structure is not especially required to provide the protecting element.

6 Claims, 12 Drawing Sheets

COMPOUND SEMICONDUCTOR SWITCHING CIRCUIT DEVICE

BACKGROUND OF THE INVENTION

1. Field of the Invention

The present invention relates to a compound semiconductor switching circuit device, and relates particularly to a compound semiconductor switching circuit device that protects from electrostatic breakdown a logic circuit provided for a switching circuit device.

2. Related Background Art

In many cases, mobile communication devices, such as mobile phones, employ a microwave frequency in a GHz band, and a switching element for switching these high frequency signals tends to be employed for an antenna switching circuit or a transmission/reception switching circuit. A field-effect transistor (hereinafter referred to as an FET) that employs gallium•arsenide (GaAs) is frequently employed as such a switching element, and because of this trend, and developments of monolithic microwave integrated circuits (MMICs) have been proceeded, in which the switching circuits are integrated.

For a conventional compound semiconductor, in order to protect a GaAs FET from the electrostatic breakdown, a pn junction diode is connected between terminals that are vulnerable to the electrostatic breakdown. This technology is described, for instance, in "Ion implantation type low-noise dual gate GaAs MESFET", Yasuo Miyawaki and three others, SANYO TECHNICAL REVIEW, Sanyo Electric Co., Ltd., August 1986, Vol. 18, No. 2, pp. 76-84.

When a logic circuit (an inverter) is connected to a switching MMIC, the number of control terminals can be reduced.

However, an enhancement type FET (hereinafter referred to as an E-FET) that constitutes a logic circuit is small and extremely vulnerable to static electricity. In order to absorb noise and prevent oscillation, a capacitor Ci is connected to an input signal side of the logic circuit, and a capacitor Cr is connected to an inverted signal side thereof. These capacitors Ci and Cr are also vulnerable to static electricity.

Therefore, generally, for the conventional compound semiconductor, a protecting diode, such as a pn junction diode, is connected so that the GaAs FET will not be destroyed by external static electricity.

However, during processes for fabricating the compound semiconductor device, a p-type impurity area for the pn junction diode must be formed separately. Since this process complicates the manufacturing processing, an increase in the manufacturing costs becomes a problem. In addition, a space for arranging the pn junction diode is also required, so that a size of a chip is increased and there is a further rise in manufacturing costs.

Furthermore, for a microwave device, parasitic capacity will be increased and the characteristic deteriorated due to a connection of the protecting diode. That is, in a case involving the logic circuit of the switching MMIC, there has been a problem that a switching speed will be reduced.

SUMMARY OF THE INVENTION

The present invention provides a switching circuit device that includes a compound semiconductor substrate, a first switching portion formed on the substrate and receiving a first control signal, a second switching portion formed on the substrate and receiving a second control signal that is a reversal of the first control signal, a logic circuit formed on the substrate and comprising an inverter connected with a power supply terminal, a control terminal and a ground terminal, the logic circuit receiving the first control signal through the control terminal, inverting the first control signal using the inverter to produce the second control signal, supplying the first control signal to the first switching portion and supplying the second control signal to the second switching portion, and a protecting element formed on the substrate and connected between the control terminal and the ground terminal, the protecting element comprising a first conduction region, a second conduction region and an insulating region that is disposed between the first and second conduction regions so as to provide a current path for surge protection.

DETAILED DESCRIPTION OF THE PREFERRED EMBODIMENTS

Preferred embodiments of the present invention will now be described in detail while referring to FIGS. 1 to 19.

Figure 1:
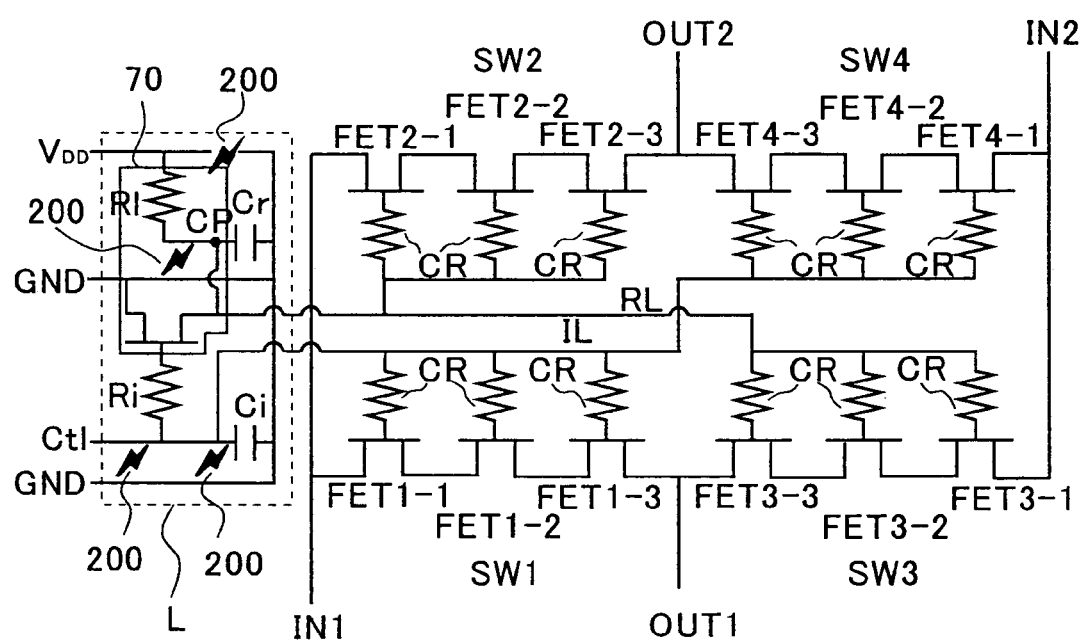
FIG. 1 is a circuit diagram for explaining a first embodiment of the present invention.

A first embodiment of the present invention will now be explained while referring to FIGS. 1 to 8. FIG. 1 is a circuit diagram showing an example DPDT (Double Pole Double Throw) switching MMIC that includes four switching elements, each of which is formed by connecting a plurality of FETs.

The DPDT is a switching MMIC that is employed, for example, for a CDMA (Code Division Multiple Access) mobile phone, and includes: first to fourth switching elements SW1, SW2, SW3 and SW4; two first RF ports (first common input terminal IN1 and second common input terminal IN2); and two second RF ports (first common output terminal OUT1 and second common output terminal OUT2). In this arrangement, a SPDT switch, constituted by the first and second switching elements SW1 and SW2, and another SPDT switch, constituted by the third and fourth switching elements SW3 and SW4, are connected by the second RF ports.

The switching elements SW1, SW2, SW3 and SW4 are FET groups, each of which is formed by connecting three FETs in series. For example, for the first switching elements SW1, FET1-1, FET1-2 and FET1-3 are connected in series; for the second switching element SW2, FET2-1, FET2-2 and FET2-3 are connected in series; for the third switching element SW3, FET3-1, FET3-2 and FET3-3 are connected in series; and for the fourth switching element SW4, FET4-1, FET4-2 and FET4-3 are connected in series.

A drain electrode (or a source electrode) at one end (FET1-3) of the first switching element SW1 is connected to a drain electrode (or a source electrode) at one end (FET3-3) of the third switching element SW3. A drain electrode (or a source electrode) at one end (FET2-3) of the second switching element SW2 is connected to a drain electrode (or a source electrode) at one end (FET4-3) of the fourth switching element SW4.

Source electrodes (or drain electrodes) at the other ends (FET1-1 and FET2-1) of the first and second switching elements SW1 and SW2 are connected to the first common input terminal IN1. Source electrodes (or drain electrodes) at the other ends (FET3-1 and FET4-1) of the third and the fourth switching elements SW3 and SW4 are connected to the second common input terminal IN2.

Further, the first common output terminal OUT1 is used in common for the first and third switching elements SW1 and SW3, and the second common output terminal OUT2 is used in common for the second and fourth switching elements SW2 and SW4. It should be noted that with regard to the switching MMIC, the source electrode and the drain electrode are equivalent. Therefore, in the following explanation, the situation is not changed at all if the source electrode and the drain electrode are exchanged.

The first to the fourth switching elements SW1 to SW4 are connected to a logic circuit L by an input signal line IL and an inverted signal line RL. That is, control resistors CR are connected to gate electrodes of the FETs of the first and the fourth switching elements SW1 and SW4, and are connected through the input signal line IL to the logic circuit L. A control signal (input signal) input to control terminal Ctl of the logic circuit L serves as a signal for the input signal line IL.

Gate electrodes of the second and third switching elements SW2 and SW3 are also connected to control resistors CR, and are connected through the inverted signal line RL to the logic circuit L. A point CP is a junction point for an inverter 70 and the inverted signal line RL. Further, an inverted signal for the control signal (input signal) input to the control terminal Ctl is transmitted to the inverted signal line RL.

The control resistors CR are arranged in order to prevent leaking, through the gate electrodes, of a high frequency signal to a direct-current potential at the control terminal Ctl that serves as an alternating-current ground, and to a direct-current potential at the point CP in the logic circuit L. The control resistors CR have resistances of about 5 KΩ to 10 KΩ.

The switching MMIC in the first embodiment comprises the logic circuit L. The logic circuit L comprises an inverter, and has the following arrangement.

The logic circuit L includes: the inverter 70, capacitors Cr and Ci, an input resistor Ri, a power supply terminal $V_{DD}$, the control terminal Ctl and a ground terminal GND. A source electrode of the inverter 70 is connected to the ground terminal GND, a drain electrode thereof is connected to the power supply terminal $V_{DD}$, and a gate electrode thereof is connected to the control terminal Ctl via the input resistor Ri.

The inverter 70 is formed by connecting an enhancement type (E type) FET (hereinafter referred to as an E-FET) to a load resistor Rl. Specifically, the source electrode of the E-FET is connected to the ground terminal GND, the drain electrode of the E-FET is connected to the point CP, and one end of the load resistor Rl is connected to the point CP while the other end thereof is connected to the power supply terminal $V_{DD}$. Further, a gate electrode of the E-FET is connected, via the input resistor Ri, to the control terminal Ctl.

In order to absorb noise and prevent oscillation, the capacitor Ci is connected between the control terminal Ctl and the ground terminal GND on the input signal side. Further, also in order to absorb noise and prevent oscillation, the capacitor Cr is connected between the point CP serving as the inverted signal side, to which the inverted signal line RL is connected, and the ground terminal GND. The input resistor Ri is positioned so that electrostatic breakdown is prevented, noise is absorbed and oscillation is prevented.

An operation of the logic circuit L (an inverter circuit) is as follows. A control signal (an input signal) received at the control terminal Ctl is inverted by the inverter 70, and an inverted signal of the input signal is generated at the point CP. That is, when a voltage at the control terminal Ctl is 3 V, a voltage at the point CP is 0 V, or when the voltage at the control terminal Ctl is 0 V, the voltage at the point CP is 3 V. Further, a protecting element 200, which will be described later, is connected to the logic circuit L.

The circuit operation of the DPDT switching MMIC in FIG. 1 is performed as follows. When a voltage of 3 V is applied to the control terminal Ctl, the first and fourth switching elements SW1 and SW4, where a signal input at the control terminal Ctl is received by the gate electrodes, are turned on. Thus, between the first common input terminal IN1 and the first common output terminal OUT1, and between the second common input terminal IN2 and the second common output terminal OUT2, signal paths are formed and are rendered conductive.

On the other hand, the second and the third switching elements SW2 and SW3, where the signal at the point CP, i.e., the 0 V inverted signal, is received by the gate electrodes, are turned off. Thus, between the first common input terminal IN1 and the second common output terminal OUT2 and between the second common input terminal IN2 and the first common output terminal OUT1 the signal paths are not formed. Further, when a voltage of 0 V is applied to the control terminal Ctl, the opposite operation is performed.

For the above described DPDT switching MMIC, the first RF ports and the second RF ports can be exchanged and employed. In this case, the path of a high frequency signal from the common input terminal to the common output terminal is reversed.

Figure 2:
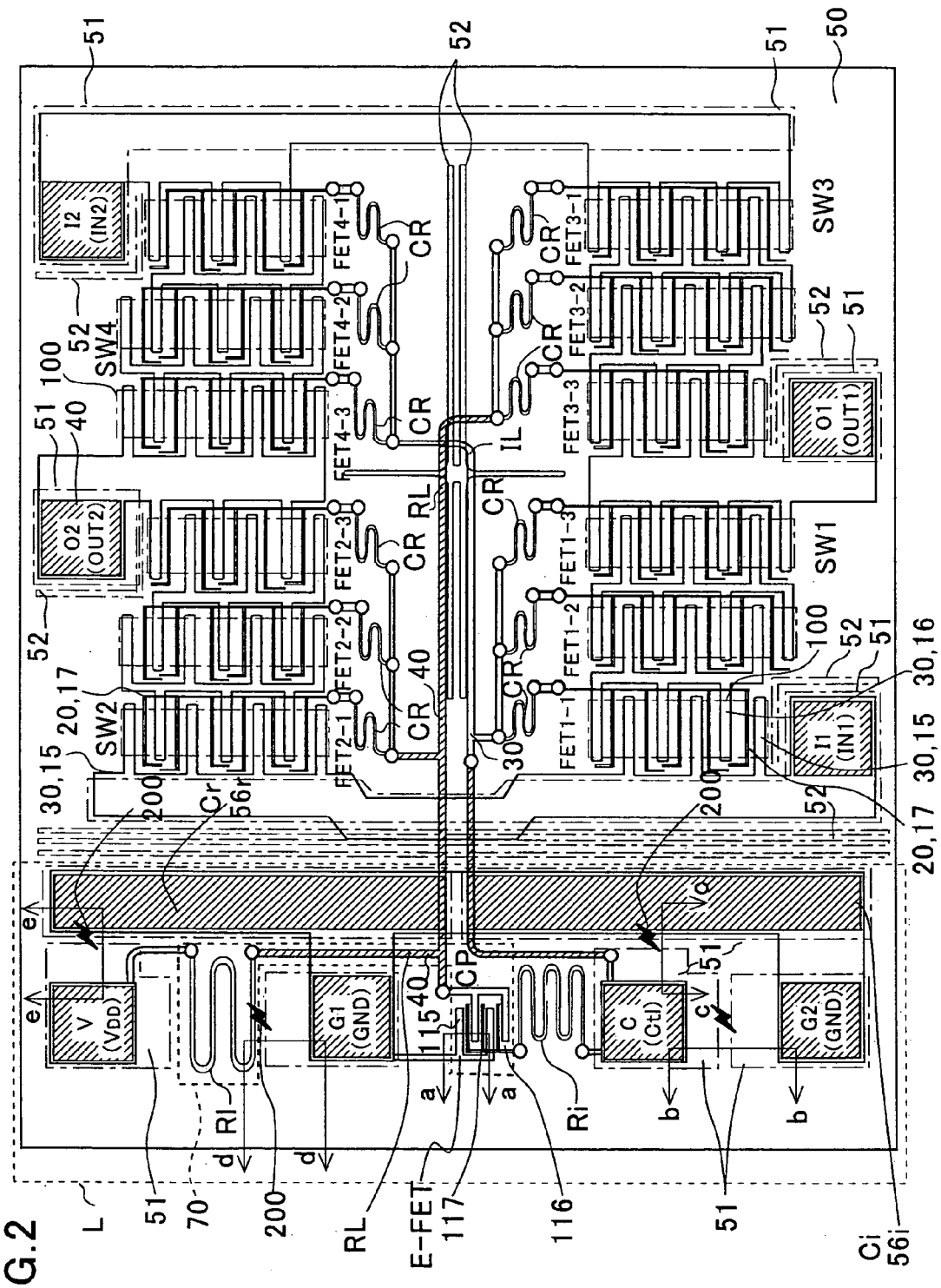
FIG. 2 is a plan view for explaining the first embodiment.

FIG. 2 is a plan view of the above described DPDT integrated into one chip of a compound semiconductor substrate. The pattern arrangement of the individual elements that constitute a circuit is almost the same as the arrangement in the circuit diagram in FIG. 1. An FET can be an MESFET (Metal Semiconductor Field Effect Transistor), a GaAs JFET (Junction FET) or an HEMT (High Electron Mobility Transistor), but in the explanation for this embodiment, mainly an HEMT is employed.

The substrate structure of an HEMT is a structure wherein, for example, buffer layers, electron supply layers, a channel (electron transit) layer and a cap layer and the like are grown on a semi-insulating GaAs substrate. Further, for an HEMT, operating regions 100 and conduction regions, such as control resistors CR, the load resistor R1 and input resistor Ri, are isolated by an insulating region 50 that reaches the buffer layers. The conduction regions in this embodiment, for example, are impurity regions.

The first to the fourth switching elements SW1 to SW4 are FET groups wherein three FETs are connected in series, and the control resistors CR are connected to the gate electrodes of the switching elements SW1 to SW4. Further, first and second common input terminal pads, I1 and I2, and first and second common output terminal pads, O1 and O2, are provided on the periphery of the substrate so that they can respectively be connected to the first and the second common input terminals, IN1 and IN2, and the first and second common output terminals, OUT1 and OUT2.

Since the individual switching elements have the same structure, the first switching element SW1 will be described below.

FET1-1, FET1-2 and FET1-3 are formed from three kinds of metal layers. The first metal layer is an ohmic metal layer (AuGe/Ni/Au) 10 that ohmically contacts the substrate, and the second metal layer is a gate metal layer (e.g., Pt/Mo) 20 that forms a Schottky junction at the surface of the substrate. And the third metal layer is a wiring metal layer (Ti/Pt/Au), and includes a first wiring metal layer 30 and a second wiring metal layer 40.

On the operating regions 100, first source electrodes and first drain electrodes are formed by the ohmic metal layer 10. It should be noted that the ohmic metal layer 10 is not shown in FIG. 2 because this layer is overlapped by the first wiring metal layer 30. Gate electrode 17, which has a comb-toothed shape, is formed by the gate metal layer 20, and individual comb-toothed portions are located between the first source electrodes and the first drain electrodes.

Second source electrodes 15 and second drain electrodes 16 are formed, comb-like, by the first wiring metal layer (Ti/Pt/Au) 30 that is superimposed on the ohmic metal layer 10. The individual pads have a dual-layer structure wherein the first wiring metal layer 30 is formed on the surface of the substrate and the second wiring metal layer 40 is overlaid.

For the FET1-1, the three portions of the first wiring metal layer 30 extending from the left serve as the second source electrodes 15, which are to be connected to the first common input terminal pad I1, and the first source electrodes, formed by the ohmic metal layer 10, are located below the second source electrodes 15. Further, the three portions of the first wiring metal layer 30 extending from the right serve as the second drain electrodes 16 for the FET1-1, and the first drain electrodes are located below the second drain electrodes 16. The second source electrodes 15 and drain electrodes 16 are arranged in such a manner that the teeth of two combs are engaged with each other, and the five gate electrodes are located between them.

In the FET1-2, the three second source electrodes 15 extending from the left are connected to the second drain electrodes 16 of the FET1-1. Since these electrodes are merely points through which a high frequency signal passes, and generally need not be led outside, no pads are provided. The four second drain electrodes 16 extending from the right are connected to the second source electrodes 15 of the FET1-3. And since these electrodes are also merely points through which a high frequency signal passes, and generally need not be led outside, no pads are provided. The ohmic metal layer 10 is disposed under these drain and source electrodes, which are arranged and engaged in the same manner as would the teeth of two combs are engaged with each other, and between them, the six gate electrodes 17 in a shape of comb-teeth are provided.

Compared with a switching circuit device wherein each switching element has only one FET as a single stage, a switching circuit device wherein each switching element has plural FETs connected in series as multiple stages can be cut off against the application of a large voltage amplitude when the FETs are OFF, and can serve as a high-power switching circuit device. In this case, since the source electrodes or the drain electrodes that are employed as joints for series connection of the FETs generally need not be led outside, pads are not required.

For the FET1-3, the three portions of the first wiring metal layer 30, extending from the left, serve as the second source electrodes 15, and the first source electrodes are located below them. Further, the four comb-tooth shaped portions of the first wiring metal layer 30, extending from the right, are the second drain electrodes 16, which are to be connected to the first common output terminal pad O1, and the first drain electrodes are located below them. These electrodes are arranged and engaged in the same manner as would the teeth of two combs are engaged with each other, and between them, the six gate electrodes 17 in a shape of comb-teeth are arranged. The gate electrodes 17 are connected to the control terminal pad C through the control resistor CR and the input signal line IL formed by the first wiring metal layer 30.

Outside the operation regions 100, the second source electrodes 15 and the second drain electrodes 16 are extended and connected to other second source electrodes 15 and the second drain electrodes 16 respectively on a nitride film (not shown).

As described above, conduction regions that are isolated by the insulating region 50 are formed for the control resistors CR, and in this embodiment, the control resistors CR are high resistance elements. The high resistance element is obtained by removing the cap layer from the HEMT epitaxial structure and by employing, as a resistor layer, only semiconductor lower layers than the cap layer having a high sheet resistance. In order to prevent the leakage of a high frequency signal, the high resistance resistor should be used for the control resistor CR, and when a high resistance element is employed as the control resistor CR, the resistance can be increased within only a short distance. On the other hand, conduction regions (impurity regions) are regions where the cap layer of the HEMT epitaxial structure is included, for the load resistor R1 and the input resistor Ri, in order to accurately obtain desired resistances.

Furthermore, on the surface of the substrate, peripheral conduction regions 51 are located around the individual pads I1, I2, O1 and O2 in order to improve their isolation and to prevent the leakage of high frequency signals. Floating potential conduction regions 52 are also formed on the surface of the substrate between the pads and the FETs, between the pads and the source (drain) electrodes, and between the individual control resistors CR. By providing the floating potential conduction regions 52, isolation can also be improved. The floating potential conduction regions 52 are also formed on the surface of the substrate below the second source electrodes 15 and the second drain electrodes 16, which are provided on the nitride film. The peripheral conduction regions 51 and the floating potential conduction regions 52 are also impurity regions isolated by the insulating region 50.

The inverted signal line RL, which is connected to the gate electrodes of the second and fourth switching elements SW2 and SW4, is formed by the second wiring metal layer 40 (Ti/Pt/Au), and is connected to the point CP in the logic circuit L.

In the logic circuit L, power supply terminal pad V, first ground terminal pad G1 and control terminal pad C, which are to be connected, respectively, to the power supply terminal $V_{DD}$, the ground terminal GND and the control terminal Ctl, are arranged along one side of the chip. Further, second ground terminal pad G2, to be connected to the ground terminal GND, is aligned with these pads. The input resistor Ri and the inverter 70 are arranged between the pads.

For the inverter 70, the drain electrode of the E-FET is connected to one end of the load resistor Rl at the point CP. And the E-FET and the load resistor R1 are connected via the inverted signal line RL.

The E-FET has the same structure as each of the FETs that constitute the first through the fourth switching elements SW1 to SW4. Specifically, second source electrode 115 and second drain electrode 116, both of which have a comb-toothed shape and are formed by the first wiring metal layer 30, are formed on the operating region 100 isolated by the insulating region 50. These electrodes are arranged so that their comb-like teeth are engaged, and gate electrodes 117, formed by the gate metal layer 20, are located between them. First source electrodes 113 and first drain electrode 114, both formed by the ohmic metal layer 10, are formed under the second source electrodes 115 and the second drain electrode 116, and are not shown in FIG. 2. The second drain electrode 116 of the E-FET is connected to the inverted signal line RL, formed by the second wiring metal layer 40, that is extended between the first ground terminal pad G1 and the capacitor Cr and is connected to one end of the load resistor R1.

Further, the second source electrode 115 of the E-FET is connected to the first ground terminal pad G1, which is located between the E-FET and the load resistor R1. The other end of the load resistor R1 is connected to the power supply terminal pad V. The gate electrodes 117 of the E-FET are connected to the control terminal pad C via the input resistor Ri. The load resistor R1 and the input resistor Ri are conduction regions (impurity regions) isolated by the insulating region 50.

In FIG. 2, the area below the E-FET is the input signal (control signal) side, and the area above the E-FET is the inverted signal side which is inverted the input signal. The capacitor Ci is located along the control terminal pad C and the second ground terminal pad G2 on the input signal side, and the capacitor Cr is located along the first ground terminal pad G1 and the power supply pad V on the inverted signal side.

The capacitors Ci and Cr are formed by respectively providing lower electrodes 55$i$ and 55$r$ (not shown) on the surface of the substrate, and by providing upper electrodes 56$i$ and 56$r$ using nitride film 60 interposed between the lower and upper electrodes. The lower electrodes 55$i$ and 55$r$ are formed by the first wiring metal layer 30, and the upper electrodes 56$i$ and 56$r$ are formed by the second wiring metal layer 40. The second wiring metal layer 40 that serves as the input signal line IL contacts the upper electrode 56$i$ of the capacitor Ci, while the second wiring metal layer 40 that serves as the inverted signal line RL contacts the upper electrode 56$r$ of the capacitor Cr. In this embodiment, the lower electrodes 55$i$ and 55$r$ of the capacitors Ci and Cr are continuous.

The lower electrode 55$i$ of the capacitor Ci on the input signal side is connected to the second ground terminal pad G2. That is, the lower electrode 55$i$ and the first wiring metal layer 30 below the second ground terminal pad G2 are continuous. Further, the lower electrode 55$r$ of the capacitor Cr on the inverted signal side is connected to the first terminal pad G1. That is, the lower electrode 55$r$ and the first wiring metal layer 30 below the first ground terminal pad G1 are continuous.

In order to provide improved isolation, the peripheral conduction regions 51, formed on the surface of the substrate, are respectively positioned around the power supply terminal pad V, around the first ground terminal pad G1, around the second ground terminal pad G2 and around the control terminal pad C. Further, the peripheral conduction regions 51, also formed on the surface of the substrate, are respectively positioned around the lower electrode 55$i$ of the capacitor Ci and around the lower electrode 55$r$ of the capacitor and Cr.

All of the peripheral conduction regions 51 in this embodiment are respectively positioned around the pads, and either at least partially contact the pads or are separated from the pads by a distance of 0 μm to 5 μm. When the peripheral conduction regions 51 contact the pads, they may be arranged so that they extend outward from the pads. The peripheral conduction region 51 may be arranged so that they are under the entire pads. According to this arrangement, the peripheral conduction regions 51 can be connected with the individual pads in a state that a direct current flows between them. The same method is applied for the peripheral conduction regions 51 of the lower electrodes 55$i$ and 55$r$.

In order to improve isolation, the floating potential conduction region 52 is also arranged on the surface of the substrate between the second source electrodes 15 of the first and the second switching elements SW1 and SW2 and the logic circuit L (the capacitors Ci and Cr).

Figure 3:
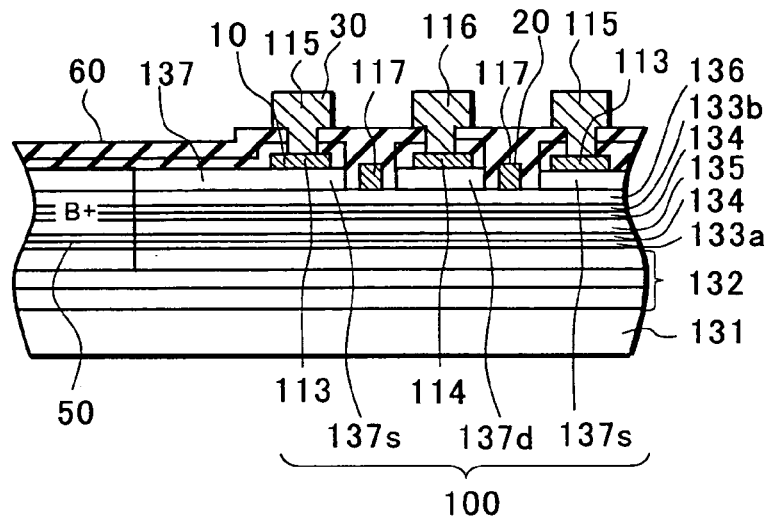
FIG. 3 is a cross-sectional view for explaining the first embodiment.

FIG. 3 is a cross-sectional view, taken along line a-a in FIG. 2, of an E-FET that includes a set of a source electrode, gate electrodes and a drain electrode.

Undoped buffer layers 132 is grown on semi-insulating GaAs substrate 131, and then, $n^+$ type AlGaAs layer 133, which serves as an electron supply layer, undoped InGaAs layer 135, which serves as a channel (electron transit layer), and $n^+$ type AlGaAs layer 133, which serves as an electron supply layer, are grown on the buffer layers 132. There are two electron supply layers 133, first electron supply layer 133$a$ and second electron supply layer 133$b$, and these two layers are located so that they sandwich the channel layer 135. Further, spacer layers 134 are arranged respectively between the channel layer 135 and each electron supply layer 133.

The buffer layers 132 is high resistance layers to which no impurity is added, and have a thickness of some several thousand Å in total. An undoped AlGaAs layer, which serves as barrier layer 136, is grown on the second electron supply layer 133$b$ to obtain a predetermined breakdown voltage and a pinch-off voltage. Further, $n^+$ type GaAs layer 137, which serves as a cap layer, is grown as a topmost layer. An impurity is added to the cap layer 137 at a high concentration of 1 to $5 \times 10^{18}$ cm$^{-3}$.

A material having a greater band gap than the channel layer 135 is employed for the electron supply layers 133, the barrier layer 136 and the spacer layers 134. Further, an n type impurity, such as Si, is added to the electron supply layers 133 at a concentration of about 2 to $4 \times 10^{18}$ cm$^{-3}$.

The operating region 100 of the HEMT is obtained by isolation, using the insulating region 50, which reaches the buffer layers 132. The epitaxial structure of the HEMT has the cap layer 137. Since the impurity added to the cap layer 137 has a high concentration of about 1 to $5 \times 10^{18}$ cm$^{-3}$, the region where the cap layer 137 is included can be functionally a high-concentration impurity region.

In this embodiment, the operating region 100 of the HEMT is defined as a region, isolated by the insulating region 50, wherein the first source electrode 113, the second source electrode 115, the first drain electrode 114, the second drain electrode 116 and the gate electrodes 117 of the HEMT are arranged. That is, the entire region wherein all the semiconductor layers, such as the electron supply layers 133, the channel (electron transit) layer 135, the spacer layers 134, the barrier layer 136 and the cap layer 137, constituting the HEMT are included is defined as the operating region 100.

The insulating region 50 is not an area that provides complete electrical insulation like insulator, but is an area in which carrier traps, provided for epitaxial layers by ion implantation of impurity ions (boron, hydrogen or oxygen), is used for insulation. That is, the impurity is present as epitaxial layers for HEMT structure in the insulating region 50. However, an inactive state is established by implantation of boron, hydrogen or oxygen that has been performed for insulation. It should be noted that when the FET is a GaAs MESFET, the insulating region 50 corresponds to a part of the semi-insulating semiconductor substrate where a conduction region (an impurity region) is not formed. And resistivity of insulating region 50 or semi-insulating semiconductor substrate is equal to or more than $1 \times 10^7$ Ω·cm and equal to or less than $1 \times 10^9$ Ω·cm. On the other hand the resistivity of insulator like glass, ceramics or gum is more than $1 \times 10^{10}$ Ω·cm. Namely insulating region 50 or semi-insulating semiconductor substrate is clearly distinguished from insulator like glass, ceramics or gum at resistivity value too. Actually insulating region 50 or semi-insulating semiconductor substrate is "semiconductor", and insulator like glass, ceramics or gum is not "semiconductor". That is, semiconductor and insulator are substantially different.

As shown in FIG. 3, in the operating region 100 source regions 137s and drain region 137d are formed by removing the cap layer 137 to which the high-concentration impurity has been added. The first source electrode 113 and the first drain electrode 114, formed by the ohmic metal layer 10, are connected to the source region 137s and the drain region 137d, and the second source electrode 115 and the second drain electrode 116 are formed thereon by the first wiring metal layer 30.

Furthermore, a part of the cap layer 137 is removed in the operating region 100 by etching to expose the undoped AlGaAs layer 136, which the gate metal layer 20 contacts to form a Schottky junction so as to form the gate electrodes 117.

The FETs that constitute the first to the fourth switching elements SW1 to SW4 have the same structures as above.

In this embodiment, a protecting element 200 is connected to the logic circuit L, and the protecting element 200 will now be described.

Figure 4:
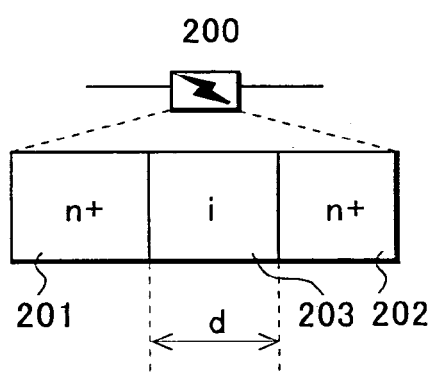
FIG. 4 is a schematic diagram for explaining the first embodiment.

FIG. 4 is a schematic diagram showing the protecting element 200. As shown in FIG. 4, for the protecting element 200, insulating region 203 is located between first and second conduction regions 201 and 202 that are formed on a substrate and are located in the vicinity to each other.

In this embodiment, the first and second conduction regions 201 and 202 are, for example, high-concentration impurity regions, and will be referred to hereinafter as first n$^+$ type region 201 and second n$^+$ type region 202. The first and second n$^+$ type regions 201 and 202 are separated by distance d, e.g., about 4 μm, across which electrostatic energy can be passed. The impurity concentration of the first and second n$^+$ type regions 201 and 202 is equal to or greater than $1 \times 10^{17}$ cm$^{-3}$. The insulating region 203 is positioned between the two regions so that it contacts the first and the second n$^+$ type regions 201 and 202.

In this case, the insulating region 203 does not provide complete electrical insulation, but is a region on a substrate insulated by ion implantation of an impurity, or is part of a semi-insulating substrate. The resistivity of the insulating region 203 is $1 \times 10^7$ Ω·cm or more and $1 \times 10^9$ Ω·cm or less. That is, the insulating region 203 is same as the insulating region 50 as described above.

The two terminals (the first and second n$^+$ type regions) of the protecting element 200 are connected to the element to be protected. Thus, electrostatic energy that is externally applied to the two terminals of the element to be protected, to which the protecting element 200 is connected, can be discharged through the insulating region 203.

The 4 μm distance between the first and the second n$^+$ regions 201 and 202 is an appropriate distance for the passage of electrostatic energy, and the distance should be greater than 3 μm or shorter than 10 μm. When the distance (the thickness of the insulating region 203) is equal to or greater than 10 μm, the resistance of the insulating region is too high for static electricity passage, and the discharge of static electricity in the protecting element 200 is not ensured. Further, for the discharge of electrostatic energy, the above described values for the impurity concentrations of the first and second n$^+$ type regions 201 and 202 and the resistance of the insulating region 203 are appropriate.

Since a high voltage, like electrostatic energy, is not applied during the normal operation of an FET, a signal will not pass through the 4 μm wide insulating region 203. Further, a high frequency signal, such as a microwave, will also not pass through the 4 μm wide insulating region 203. Therefore, during normal operation, the protecting element 200 will not adversely affect the characteristic. However, static electricity is a phenomenon during which a high voltage is applied momentarily, and in this case, electrostatic energy will pass through the 4 μm wide insulating region 203, and a discharge will occur between the first and the second n$^+$ type regions 201 and 202. But when the distance (the thickness of the insulating region 203) is equal to or smaller than 3 μm, there is a case where a microwave pass through the insulating region 203 during normal operation.

In the HEMT epitaxial structure as shown in FIG. 3, the region wherein the cap layer 137 is included is a high-concentration impurity region. That is, respective sides of the insulating region 50 having the thickness of 4 μm become the first and the second n$^+$ type regions 201 and 202.

The first and the second n$^+$ type regions 201 and 202 may be used as terminals for the protecting element 200, or metal electrodes connected to these regions may be provided.

In this embodiment, the protecting element 200 is connected to the logic circuit L. The E-FET that constitutes the logic circuit L is small, and extremely vulnerable to static electricity. The capacitors Ci and Cr are also vulnerable to static electricity. Thus, the protecting elements 200 are connected to these components to prevent electrostatic breakdown.

That is, the protecting element 200 is connected between the control terminal Ctl and the ground terminal GND, between the point CP and the ground terminal GND, and between the power supply $V_{DD}$ and the ground terminal GND in the logic circuit L, respectively.

First, the connection of the protecting element 200 between the control terminal Ctl and the ground terminal GND will be explained. In this embodiment, two protecting elements 200 are connected between the control terminal Ctl and the ground terminal GND. That is, the protecting elements 200 are respectively connected between the control terminal pad C and the second ground terminal pad G2 and between the control terminal pad C and the capacitor Ci.

Figure 5:
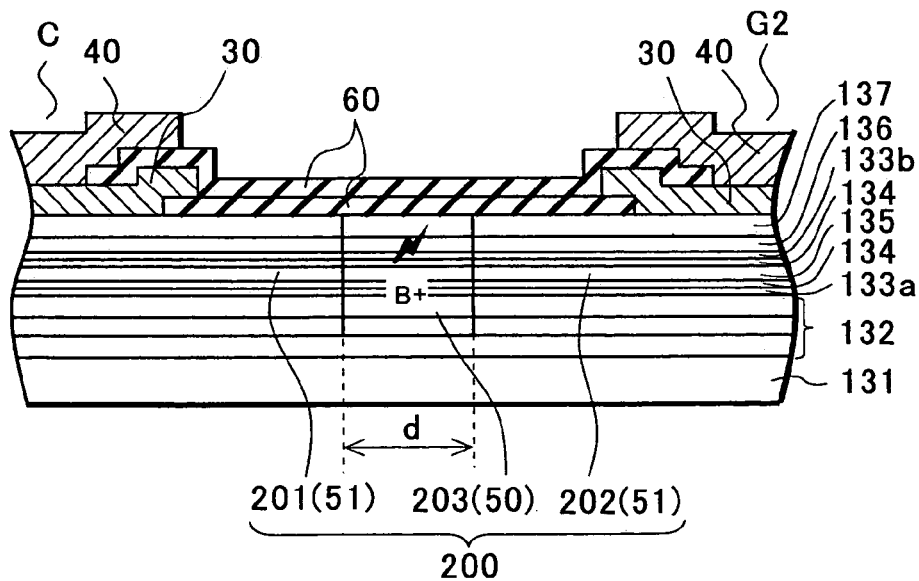
FIG. 5 is a cross-sectional view for explaining the first embodiment.

FIG. 5 is a cross-sectional view, taken along line b-b in FIG. 2, of the connection of the protecting element 200 between the control terminal pad C and the second ground terminal pad G2.

As described above, in order to improve isolation, the peripheral conduction regions 51 are respectively positioned around the control terminal pad C and around the second ground terminal pad G2. In FIG. 5, the peripheral conduction regions 51 are formed on the surface of the substrate, beneath the entire faces of the pads C and G2, so that the ends of the peripheral conduction regions 51 project outward, beyond the ends of the pads C and G2. Below the pads C and G2 the nitride films 60 is opened, and the first wiring metal layer 30 and the peripheral conduction regions 51 are connected together in a state that a direct current flows between them (a Schottky junction is formed).

The two peripheral conduction regions 51 are isolated by the insulating region 50 formed by ion (boron, hydrogen or oxygen) implantation. That is, the two peripheral conduction regions 51, which are isolated by the distance d that is set to 4 μm, are employed as terminals for the protecting element 200, so that the protecting element 200 can be provided.

In this case, for example, the peripheral conduction region 51 for the control terminal pad C is the first $n^+$ type region 201, and the peripheral conduction region 51 for the second ground terminal pad G2 is the second $n^+$ type region 202. The insulating region 50 located between these regions 201 and 202 is employed as the insulating region 203 of the protecting element 200. When the width d of the insulating region 50 is set to 4 μm, the protecting element 200 can be connected between the control terminal pad C and the second ground terminal pad G2. It should be noted that this arrangement can be applied when the relative positions of the first $n^+$ type region 201 and the second $n^+$ type region 202 are exchanged.

As shown in FIG. 2, the control terminal pad C is connected via the input resistor Ri to the gate electrodes 117 of the E-FET, and the second ground terminal pad G2 is connected to the lower electrode 55i of the capacitor Ci. The lower electrode 55i is connected to the first ground terminal pad G1 via the lower electrode 55r, which is continuous with the lower electrode 55i. The first ground terminal pad G1 is connected to the second source electrode 115 of the E-FET.

That is, the connection of the protecting element 200 between the control terminal pad C and the second ground terminal pad G2 is the connection of the protecting element 200 between the gate electrode and the source electrode of the E-FET and between the upper electrode 56i and the lower electrode 55i of the capacitor Ci. In this case, the control terminal pad C and the second ground terminal pad G2 are metal electrodes provided for the protecting element 200.

As previously described, in order to protect the FET from electrostatic breakdown, it is desirable that electrostatic energy applied to the Schottky junction of the gate electrodes being vulnerable to static electricity is reduced. According to the embodiment, the protecting element 200, wherein the insulating region 203 is located between the two conduction regions (high-concentration impurity regions) 201 and 202 (hereinafter referred to as an n-i-n type), is connected between the control terminal Ctl and the ground terminal GND of the logic circuit L. With this arrangement, the Schottky junction of the gate electrodes and the source electrode of the E-FET of the logic circuit L can be protected from static electricity, while at the same time, the capacitor Ci, which is vulnerable to electrostatic breakdown, is also protected from static electricity.

The protecting element 200 includes: the peripheral conduction regions 51, which are respectively positioned around the control terminal pad C and around the second ground terminal pad G2 in order to improve isolation; and the insulating region 50, which isolates the peripheral conduction regions 51. All of these are basic components of the logic circuit L, and once the arrangement of these components has been worked out, the prevention of electrostatic breakdown, requiring the employment of no components except the basic components, is ensured. That is, unlike the case wherein a pn junction diode is employed as a protecting diode, the protecting element can be provided without adding a special structure or a special process step.

Figure 6:
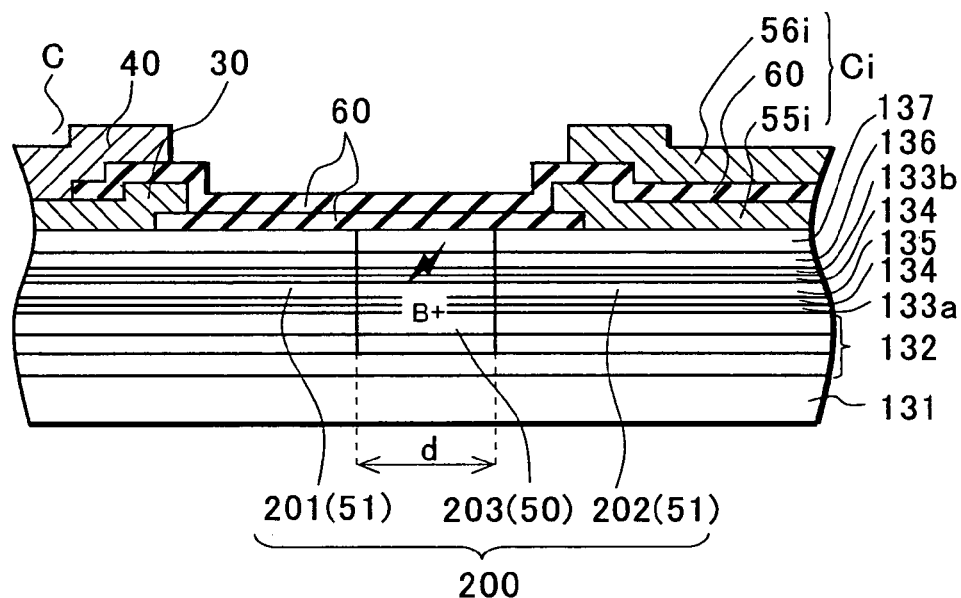
FIG. 6 is a cross-sectional view for explaining the first embodiment.

FIG. 6 is a cross-sectional view, taken along line c-c in FIG. 2, of the connection of the protecting element 200 between the control terminal Ctl and the ground terminal GND, specifically, the connection of the protecting element 200 between the control terminal pad C and the capacitor Ci.

For the capacitor Ci, the nitride film 60 that serves as a dielectric material is formed between the lower electrode 55i and the upper electrode 56i, and the peripheral conduction region 51 is located around the lower electrode 55i. Under the lower electrode 55i the nitride film 60 is opened, and the lower electrode 55i and the peripheral conduction region 51 are connected together in a state that a direct current flows between them (a Schottky junction). Further, in the same manner as shown in FIG. 5, the peripheral conduction region 51 is located around the control terminal pad C, and is connected to the control terminal pad C in a state that a direct current flows between them.

The peripheral conduction region 51 for the control terminal pad C is the first $n^+$ type region 201 for the protecting element 200, the peripheral conduction region 51 for the lower electrode 55i is the second $n^+$ type region 202, and the two regions 51 are isolated by the insulating region 50 having the 4 μm width d. As a result, the n-i-n type protecting element 200 is connected between the control terminal pad C and the lower electrode 55i (ground terminal GND) of the capacitor Ci.

The control terminal pad C is connected via the input resistor Ri to the gate electrodes 17 of the E-FET. And the lower electrode 55i of the capacitor Ci is connected the source electrode 115 of the E-FET, because the lower electrode 55i of the capacitor Ci, the lower electrode 56r of the capacitor Cr, ground terminal pad G1 and the source electrode 115 of the E-FET are continuous using the first wiring metal layer 30 in this order.

That is, the connection of the protecting element 200 between the control terminal pad C and the lower electrode 55i of the capacitor Ci is the connection of the protecting element 200 between the gate electrodes and the source electrode of the E-FET.

Furthermore, in either case shown in FIG. 5 or 6, since the protecting element 200 is connected between both ends of the capacitor Ci (between the upper electrode 56i and the lower electrode 55i), the electrostatic breakdown of the capacitor Ci can also be prevented.

That is, the connection of the protecting element 200, as shown in FIGS. 5 and 6, can prevent the electrostatic breakdown of the E-FET and the capacitor Ci that constitute the logic circuit L.

Figure 7:
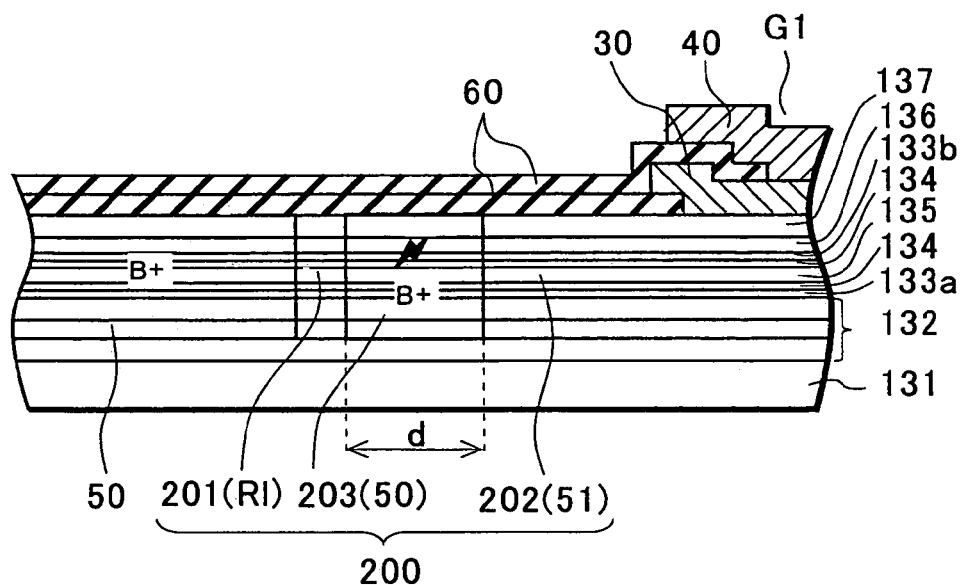
FIG. 7 is a cross-sectional view for explaining the first embodiment.

The connection of the protecting element 200 between the point CP and the ground terminal GND will now be described while referring to FIGS. 2 and 7. FIG. 7 is a cross-sectional view taken along line d-d in FIG. 2.

The inverted signal line RL (the second wiring metal layer 40) connected to the point CP is extended between the first ground terminal pad G1 and the capacitor Cr, and is connected to the load resistor R1. In this embodiment, as shown in FIG. 2, the protecting element 200 is connected between a portion of the load resistor R1 close to the inverted signal line RL (the second wiring metal layer 40) connected to the point CP, and the first ground terminal pad G1.

The load resistor R1 is also a conduction region isolated by the insulating region 50. The peripheral conduction region 51 is also located around the first ground terminal pad G1, and is connected to the first ground terminal G1 in a state that a direct current flows between them. A part of the conduction region that constitutes the load resistor R1 is the first $n^+$ type region 201 and the peripheral conduction region 51 for the first ground terminal pad G1 is the second $n^+$ type conduction region 202. When these regions 201 and 202 are isolated by the insulating region 50 having the 4 μm width, the protecting element 200 can be connected between the point CP and the first ground terminal pad G1.

The point CP is connected to the second drain electrode 116 of the E-FET, and the first ground terminal pad G1 is connected to the second source electrode 115 of the E-FET. That is, since the protecting element 200 is connected between the source and drain electrodes of the E-FET, E-FET can be protected from static electricity between the source and drain. For the FET, the gate Schottky junction is most vulnerable to electrostatic breakdown. However, the E-FET that constitutes the inverter 70 is especially small, and it is preferable that E-FET is protected from electrostatic breakdown also between source and drain.

Further, in this case, the first ground terminal pad G1 is connected to the lower electrode 55r of the capacitor Cr, and the load resistor R1 is connected to the upper electrode 56r of the capacitor Cr via the inverted signal line RL.

That is, the protecting element 200 is also connected to both ends of the capacitor Cr, so that the capacitor Cr is also protected from static electricity.

The connection of the protecting element 200 between the power supply terminal $V_{DD}$ and the ground terminal GND will now be described.

Figure 8:
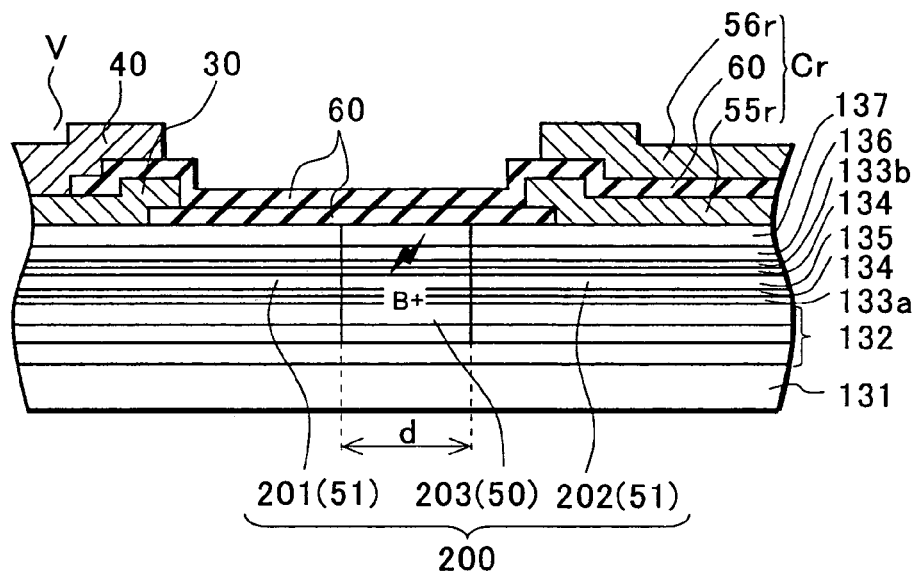
FIG. 8 is a cross-sectional view for explaining the first embodiment.

FIG. 8 is a cross-sectional view, taken along line e-e in FIG. 2, of the connection of the protecting element 200 between the power supply terminal pad V and the capacitor Cr.

This structure is the same as that shown in FIG. 6. Specifically, the peripheral conduction region 51 is located around the power supply pad V, and the peripheral conduction region 51 and the power supply pad are connected together in a state that a direct current flows between them. The peripheral conduction region 51 is also located around the lower electrode 55r of the capacitor Cr, and the peripheral conduction region 51 and the lower electrode 55r are connected together in a state that a direct current flows between them (a Schottky junction). These peripheral conduction regions 51 are respectively regarded as the first $n^+$ type region 201 and the second $n^+$ type region 202, and are isolated by the insulating region 50 having the 4 μm width. As a result, the protecting element 200 is connected between the power supply terminal pad V and the capacitor Cr.

The lower electrode 55r of the capacitor Cr is connected to the first ground terminal pad G1. That is, in the circuit, the protecting element 200 is connected between the power supply terminal $V_{DD}$ and the ground terminal GND, and static electricity applied to the power supply terminal $V_{DD}$ can be released to the ground terminal GND.

Further, the power supply terminal pad V is connected via the load resistor R1 to the second drain electrode 116 of the E-FET that is a constituent of the inverter 70. That is, the application of static electricity to the drain electrode of the E-FET and the capacitor Cr is prevented.

As described above, in this embodiment, the logic circuit L is formed by employing the pattern shown in FIG. 2, and the protecting elements 200 are respectively connected between the control terminal Ctl and the ground terminal GND, between the point CP and the ground terminal GND, and between the power supply terminal $V_{DD}$ and the ground terminal GND. Therefore, the E-FET that constitutes the inverter 70, and the capacitors Ci and Cr can be protected from electrostatic breakdown due to external static electricity.

Figure 9:
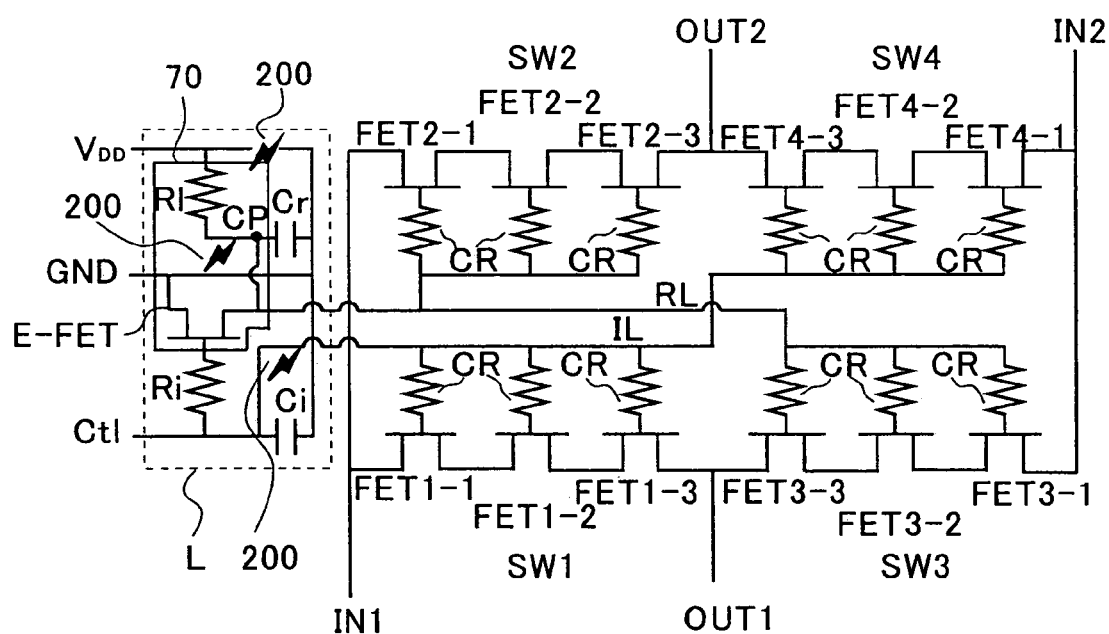
FIG. 9 is a circuit diagram for explaining a second embodiment of the present invention.
Figure 10:
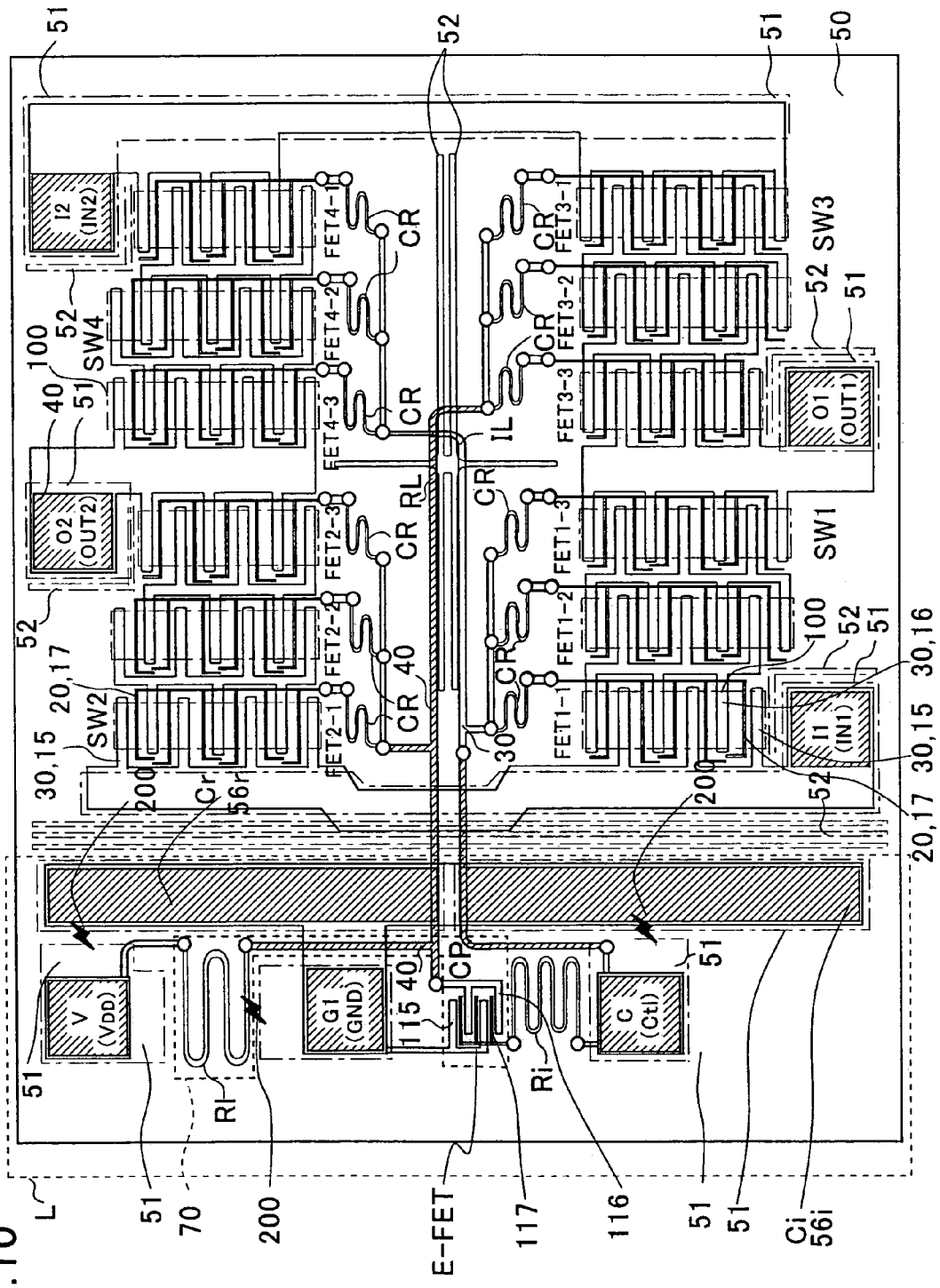
FIG. 10 is a plan view for explaining the second embodiment.

A second embodiment of the present invention will now be described while referring to FIGS. 9 and 10. FIG. 9 is a circuit diagram, and FIG. 10 is a plan view.

The second embodiment is a case wherein no second ground terminal pad G2 is provided. Lower electrode 55i of capacitor Ci and lower electrode 55r of capacitor Cr are continuous and are connected to first ground terminal pad G. That is, logic circuit L normally operates when the second ground terminal pad G2 of the first embodiment (FIG. 2) is not provided. According to the second embodiment, the protecting element 200 (FIG. 5) indicated by a line b-b in FIG. 2 is not connected. However, by employing the protecting element 200 (FIG. 6), indicated by a line c-c in FIG. 2, devices between control terminal Ctl and ground terminal GND can be protected.

Since other components are the same as those in the first embodiment, no further explanation for them will be given.

Figure 11:
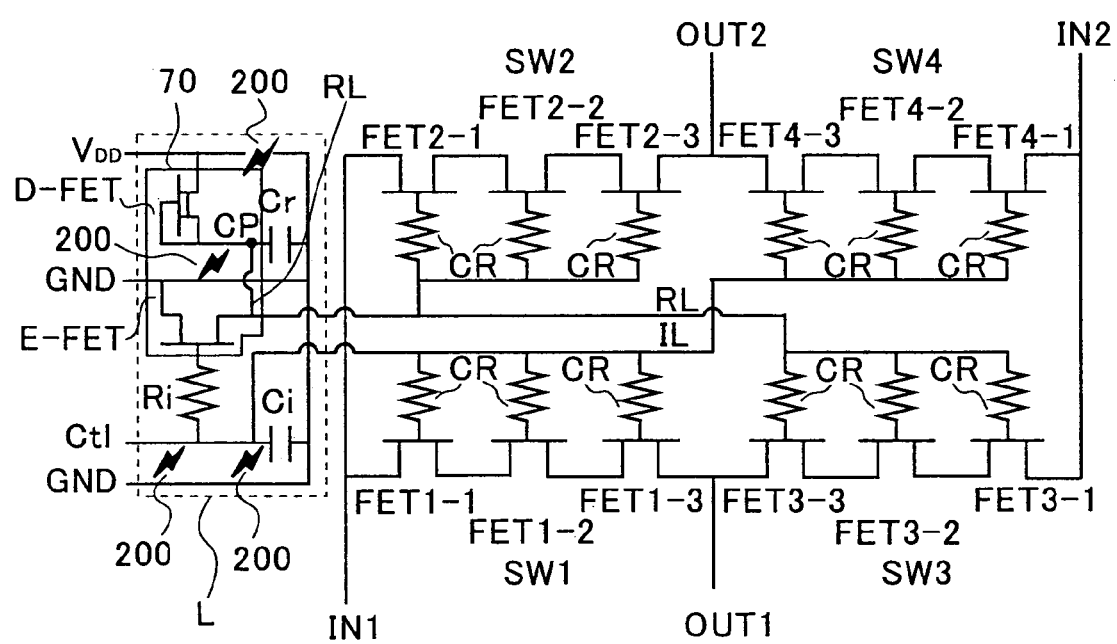
FIG. 11 is a circuit diagram for explaining a third embodiment of the present invention.
Figure 13A:
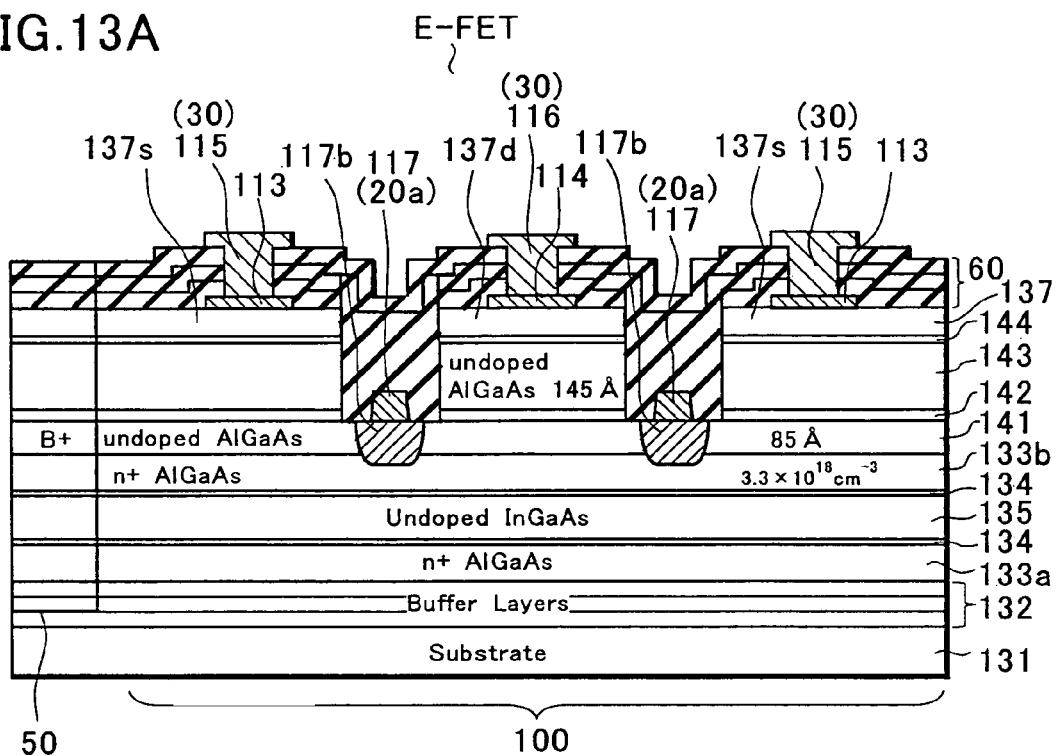
FIGS. 13A and 13B are cross-sectional views for explaining the third embodiment.
Figure 13B:
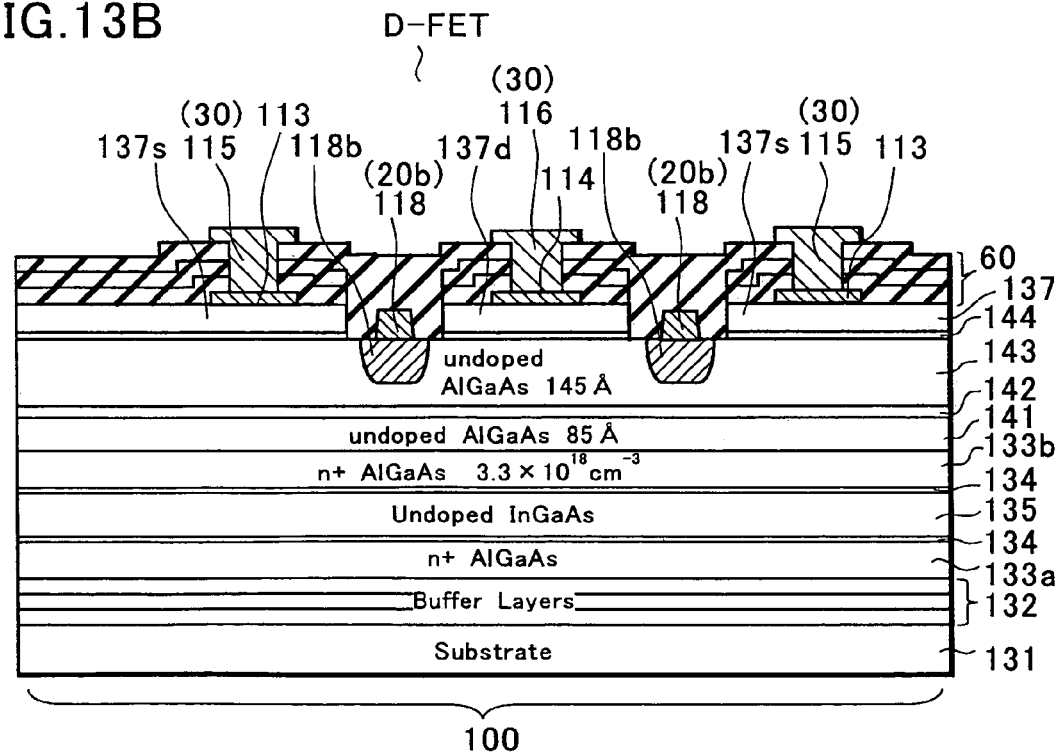
Figure 14:
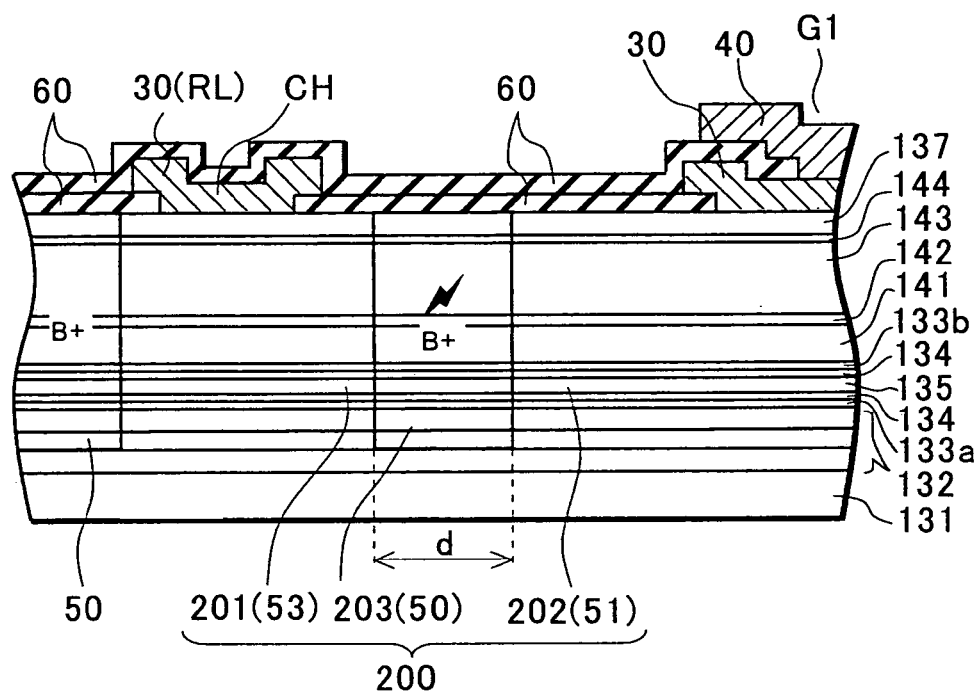
FIG. 14 is a cross-sectional view for explaining the third embodiment.

A third embodiment of the present invention will now be explained while referring to FIGS. 11 to 14. FIG. 11 is a circuit diagram showing a switching circuit device, FIG. 12 is a plan view of a switching circuit device, FIGS. 13A and 13B are cross-sectional views of devices that constitute an inverter, and FIG. 14 is a cross-sectional view of a protecting element.

According to the third embodiment, inverter 70 is called an E/D type DCFL (Direct Coupled FET Logic) wherein a depletion type FET (hereinafter referred to as a D-FET) is connected to an E-FET.

As shown in FIG. 11, via inverted signal line RL, the D-FET that serves as a load element is connected in series to the E-FET that performs switching. Gate electrodes of the E-FET are connected to control terminal Ctl, and the gate electrodes and source electrode of the D-FET are connected to drain electrode of the E-FET. Drain electrode of the D-FET is connected to power supply terminal $V_{DD}$.

Figure 12:
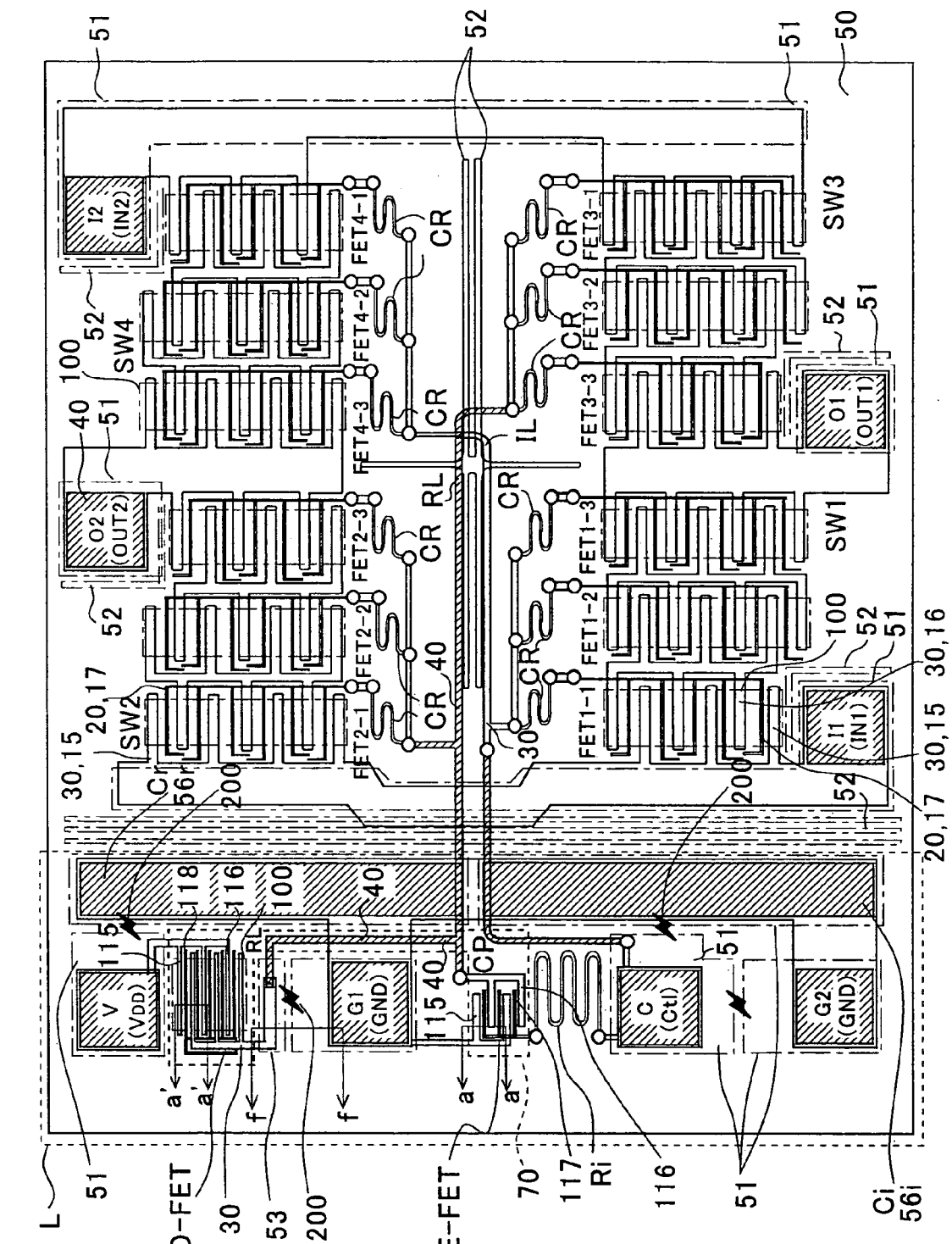
FIG. 12 is a plan view for explaining the third embodiment.

As shown in FIG. 12, the inverted signal line RL, formed by second wiring metal layer 40, is extended from point CP to connect the E-FET and the D-FET. Since the plan pattern for the E-FET is the same as that in the first embodiment, no further explanation for it will be given.

For the D-FET, on operating regions 100 that are isolated by insulating region 50, second source electrode 115, which has a comb-toothed shape, and second drain electrode 116, which also has a comb-toothed shape, are formed by first wiring metal layer 30. The second source electrode 115 and the second drain electrode 116 are so located that their comb-toothed portions are engaged with each other, and gate electrodes 118, formed by a gate metal layer 20, are arranged between the comb-toothed portions. First source electrode and first drain electrode (not shown), formed by an ohmic metal layer 10, are located below the second source electrode 115 and the second drain electrode 116.

Second drain electrode 116 of the E-FET is connected to inverted signal line RL formed by the second wiring metal layer 40. The second wiring metal layer 40, which serves as the inverted signal line RL, is connected to the first wiring metal layer 30, and is connected to the second source electrode 115 of the D-FET.

FIGS. 13A and 13B are cross-sectional views of the E-FET and the D-FET that constitute the inverter 70. FIG. 13A is a cross-sectional view of the E-FET taken along line a-a in FIG. 12, and FIG. 13B is a cross-sectional view of the D-FET taken along line a'-a' in FIG. 12.

A substrate of HEMT is formed by growing a plurality of semiconductor layers on a semi-insulating GaAs substrate 131. The plurality of semiconductor layers are undoped buffer layers 132, electron supply layers 133, channel (electron transit) layer 135, first undoped layer 141, second undoped layer 142, third undoped layer 143, stable layer 144 and cap layer 137.

There are two electron supply layers 133, i.e., first electron supply layer 133a and second electron supply layer 133b, which are located above and below the channel layer 135. Spacer layers 134 are arranged between the channel layer 135 and each of the electron supply layers 133. An n$^+$ type GaAs layer 137 that serves as the cap layer is the topmost layer grown.

The buffer layers 132 are high resistance layers to which no impurity is added, and has a thickness of several thousand Å in total.

A material having a greater band gap than that of the channel layer 135 is employed for the electron supply layers 133 (the first electron supply layer 133a and the second electron supply layer 133b). Further, a concentration of an n$^+$ type impurity (e.g., Si) in an n$^+$ type AlGaAs layers, which are the electron supply layers 133, is related to pinch-off voltage Vp, on-resistance Ron and a breakdown voltage, and in this embodiment, is set to $3.3 \times 10^{18}$ cm$^{-3}$.

In addition, the first electron supply layer 133a and the second electron supply layer 133b are located above and below the channel layer 135, respectively. With such a double heterojunction structure, a carrier density can be increased, and the on-resistance Ron can be much reduced.

The first undoped layer 141 is overlaid and contacts the second electron supply layer 133b, and gate electrodes 117 of the E-FET are formed on its surface. A thickness of the undoped layer 141 is set to ensure a predetermined pinch off voltage Vp of the E-FET. Further, lattice matching of the first undoped layer 141 and the second electron supply layer 133b is obtained. The first undoped layer 141 is an undoped AlGaAs layer having a thickness of 85 Å. When even a slight crystal distortion has occurred near the channel layer 135, a satisfactory HEMT characteristic can not be obtained with appropriate reproducibility. However, since the first undoped layer 141 is the same AlGaAs layer as the second electron supply layer 133b, near the channel layer 135, a material that causes crystal distortion can be completely removed from a portion near the channel layer 135.

The second undoped layer 142 is overlaid and contacts the first undoped layer 141, and lattice matching with the first undoped layer 141 is obtained. The second undoped layer 142 is an undoped InGaP layer having a thickness of 20 Å. Furthermore, the second undoped layer 142 serves as an etching stop layer for the third undoped layer 143, which is overlaid and contacts the layer 142.

The third undoped layer 143 is overlaid and contacts the second undoped layer 142, and lattice matching with the second undoped layer 142 is obtained. The third undoped layer 143 is an undoped AlGaAs layer having a thickness of 145 Å. The gate electrodes 118 of the D-FET are formed on a surface of the third undoped layer 143. Further, since crystal growth for an AlGaAs layer is stable, compared with that for an InGaP layer, a predetermined characteristic of the D-FET can also be stably obtained by forming the gate electrodes on the AlGaAs layer.

The total thickness of the first to the third undoped layers 141 to 143 is designed so as to obtain the predetermined pinch-off voltage Vp of the D-FET.

The stable layer 144 is overlaid and contacts the third undoped layer 143, and lattice matching with the third undoped layer 143 is obtained. The lattice matching is also performed between the stable layer 144 and the cap layer 137 thereon. The stable layer 144 is an undoped InGaP layer or a doped InGaP layer that is not easily oxidized, that is resistant to external chemical stress and that has reliable stability, and a thickness of this layer is 100 Å. During a manufacturing process, where plasma etching is performed for a nitride film, a surface of the operating region 100 is covered with the stable layer 144 to protect the operating region 100 from the plasma damage. A 100 Å thickness of the stable layer 144 can satisfactorily protect the operating region 100 from plasma damage. Further, the stable layer 144 also serves as an etching stop layer for the cap layer 137, which is a GaAs layer.

In the structure of this embodiment, since the InGaP layer and the AlGaAs layer that serve as etching stop layers to each other are repetitively grown, the predetermined pinch-off voltage Vp can be easily obtained, with high reproducibility.

Furthermore, since lattice matching of the InGaP layer is performed to the GaAs layer and the undoped AlGaAs layer, crystal distortion can be avoided, and a crystal defect, such as a slit, can be prevented.

A thickness of the cap layer 137 is equal to or greater than 600 Å, and an impurity concentration is equal to or greater than $2 \times 10^{18}$ cm$^{-3}$. Preferably, the thickness should be about 1000 Å, and the impurity concentration should be equal to or greater than $3 \times 10^{18}$ cm$^{-3}$.

The cap layer 137 is patterned to obtain a desired shape, and source region 137s and drain region 137d are formed. The first source electrode 113 contacts the source region 137s and the first drain electrode 114 contacts the drain region 137d. The second source electrode 115 and the second drain electrode 116, both formed by the first wiring metal layer 30, contact the first source electrode 113 and the first drain electrode 114 that are formed by the ohmic metal layer 10.

The gate electrodes 118 of the D-FET and the gate electrodes 117 of the E-FET are arranged between the source regions 137s and the drain regions 137d.

The stable layer 144 is etched by employing the same pattern as that used for the cap layer 137 grown atop it. Further, for the E-FET, the second undoped layer 142 and the third undoped layer 143 are etched by using the same pattern as that employed for the cap layer 137.

The insulating region 50 that reaches the buffer layers 132 isolates the operating region 100 of the HEMT from other elements, such as a resistor, of the switching circuit device. The operating region 100 of this embodiment is a region where the source electrodes 115 and 135, the drain electrodes 116 and 136 and the gate electrodes 117 and 118 of the HEMT are located. That is, the entire area, to include the all semiconductor layers constituting the HEMT, such as the electron supply layers 133, the channel (electron transit) layer 135, the spacer layers 134, the first to third undoped layers 141 to 143, the stable layer 144 and the cap layer 137, serves as the operating region 100.

The gate electrodes 117 of the E-FET are formed by evaporation of gate metal layer 20a on a surface of the first undoped layer 141, in the operating region 100, which is exposed between the source region 137s and the drain region 137d. One part of the lowermost metal (Pt: platinum) layer formed by evaporation is buried in the operating region 100 by heat process. The buried Pt (hereinafter these areas are referred to as buried portions 117b) also functions as the gate electrodes 117. When the bottoms of the buried portions 117b are positioned, for example, in the second electron supply layer 133b, the gate electrodes 117 and the buried portions 117b form Schottky junctions with the first undoped layer 141 and the second electron supply layer 133b.

The gate electrodes 118 of the D-FET are formed, by evaporation of gate metal layer 20b, on the surface of the third undoped layer 143, of the operating region 100 between the source region 137s and the drain region 137d. Then, part of the bottom metal layer (Pt) formed by evaporation is buried in the surface of the operating region 100 by heat. The buried Pt (buried portions 118) also functions as the gate electrodes 118.

In such an buried gate structure, the ends of the Pt portions that are diffused in the operating region 100 are bent outward, with a predetermined curvature radius. Thus, a electric field concentration can be relaxed, and the breakdown voltage can be increased.

According to the third embodiment, the protecting element 200 is to be connected between the point CP and a ground terminal GND, and more specifically, between the second source electrode 115 of the D-FET and a first ground terminal pad G1. It should be noted that the same connection is performed when the source electrode and the drain electrode of the D-FET are exchanged.

FIG. 14 is a cross-sectional view taken along a line f-f in FIG. 12.

Conduction region 53 is formed beneath the first wiring metal layer 30 (the inverted signal line RL) that is connected to the second source electrode 115 of the D-FET. The conduction region 53 is a high-concentration impurity region ($n^+$ type impurity region), and is simultaneously isolated by the insulating region 50, together, for example, with a peripheral conduction region 51.

Further, the peripheral conduction region 51 is arranged on one side of the first ground terminal pad G1 opposite to the $n^+$ type impurity region 53.

The first wiring metal layer 30 contacts the $n^+$ type impurity region 53 through a contact hole CH, which is formed in nitride film 60 under the first wiring metal layer 30. The first wiring metal layer 30 and the $n^+$ type impurity region 53 are connected together to form a Schottky junction in a state that a direct current flows between them. The first wiring metal layer 30 and the $n^+$ type impurity region 53 may be connected ohmically. The first ground terminal pad G1 and the peripheral conduction region 51 are also connected in a state that a direct current flows between them.

The $n^+$ type impurity region 53 is a first $n^+$ type region 201 and the peripheral conduction region 51 for the first ground terminal pad G1 is a second $n^+$ type region 202. When the regions 201 and 202 are disposed interposing the insulating region 50, which has a width of 4 μm, the protecting element 200 is connected between the point CP and the first ground terminal pad G1.

That is, the protecting element 200 is connected to both ends of the capacitor Cr, so that the capacitor Cr can also be protected from static electricity.

Since other components are the same as those of the first embodiment, no further explanation for them will be given.

A fourth embodiment of the present invention will now be described while referring to FIGS. 15 to 19. This embodiment can be applied not only for the above described HEMT epitaxial structure, but also for a switching MMIC that is provided by employing a GaAs MESFET wherein a conduction region (impurity region) is formed, using ion implantation, in a GaAs semi-insulating substrate.

The plan views in FIGS. 2 and 12 are also employed for this embodiment. Cross sections shown in FIGS. 15 to 18 correspond to cases wherein the conduction region are formed using ion implantation in FIGS. 5 to 8. A cross-section in FIG. 19 corresponds to a case wherein the state shown in FIG. 14 is formed using ion implantation.

Although not shown in the drawings, an operating region 100, for example, is an n type impurity region that is formed in an undoped GaAs substrate using ion implantation, and a source region 137s and a drain region 137d are $n^+$ type impurity region formed using ion implantation. Further, peripheral conduction regions 51, for improvement of isolation, and a conduction region 52, which has a floating potential, are $n^+$ type impurity regions that are simultaneously formed using ion implantation, with the source region 137s and the drain region 137d. A control resistor (a high resistance element) is an n type impurity region that is simultaneously formed using ion implantation with the operating region 100.

Figure 15:
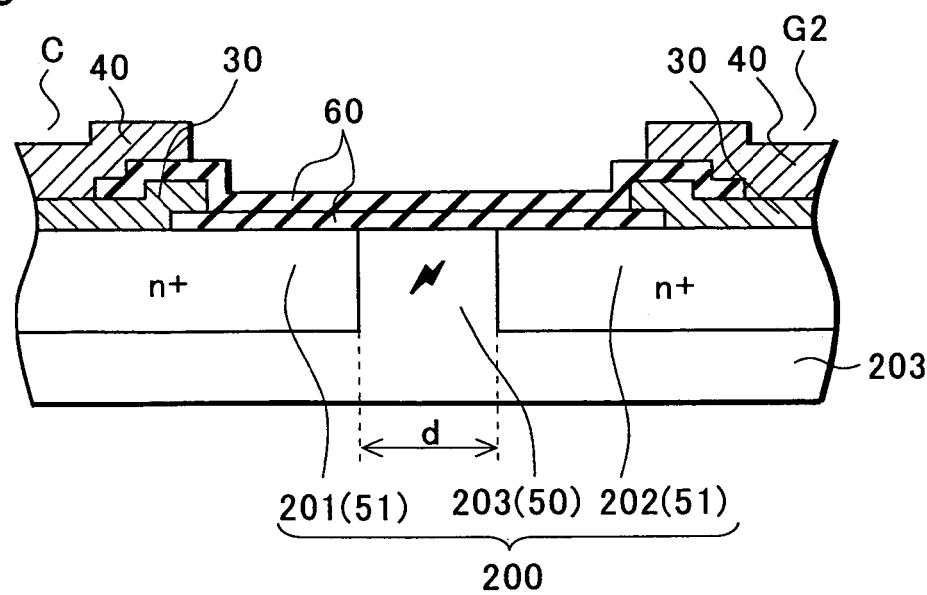
FIG. 15 is a cross-sectional view for explaining a fourth embodiment of the present invention.
Figure 16:
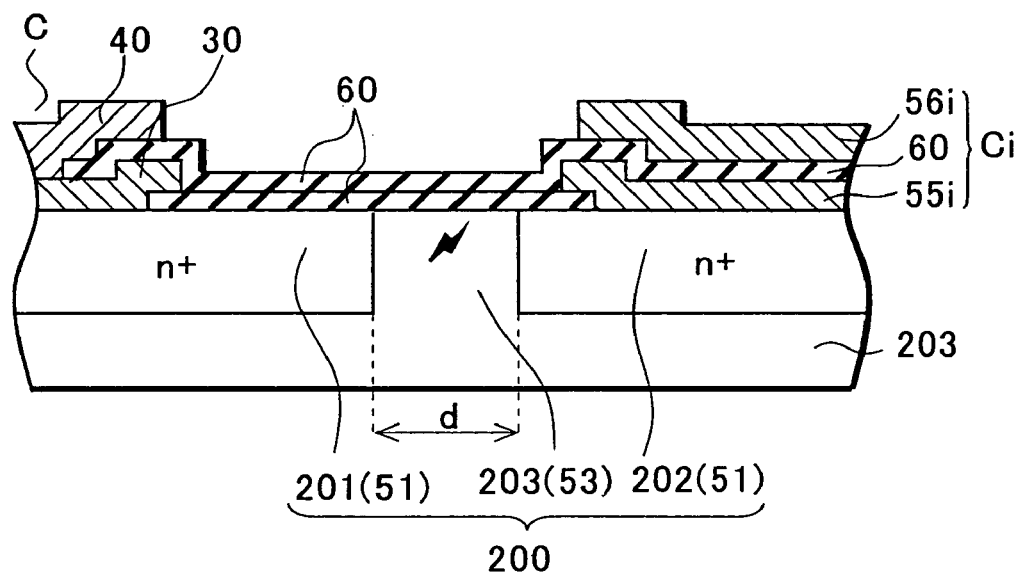
FIG. 16 is a cross-sectional view for explaining the fourth embodiment.

That is, as shown in FIGS. 15 and 16, the peripheral conduction region 51 near a control terminal C and the peripheral conduction region 51 near a second ground terminal pad G2 are employed, as a first $n^+$ type impurity region 201 of a protecting element 200 and a second $n^+$ type impurity region 202 thereof (FIG. 15). Further, the peripheral conduction region 51 near the control terminal pad C and the peripheral conduction region 51 near a lower electrode 55i of a capacitor Ci are employed as a first $n^+$ type impurity region 201 of the protecting element 200 and a second $n^+$ type impurity region 202 thereof (FIG. 16). In this case, a part of an undoped GaAs substrate 203 serves as insulating region 203. When the first $n^+$ type impurity region 201 and the second $n^+$ type impurity region 202 are located at distance d of 4 μm, the protecting element 200 can be connected between a control terminal Ctl and a ground terminal GND.

Figure 17:
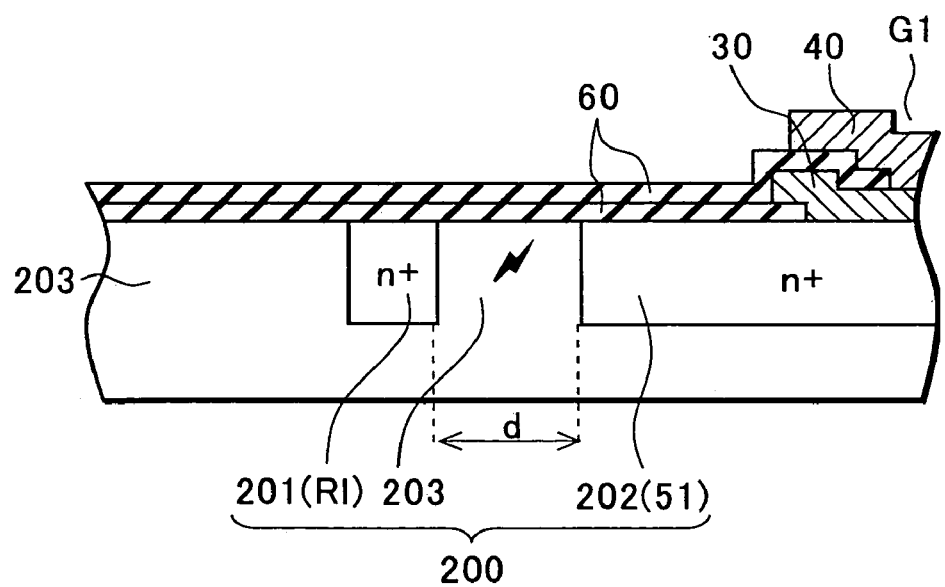
FIG. 17 is a cross-sectional view for explaining the fourth embodiment.

Furthermore, as shown in FIG. 17, a load resistor R1 is also employed as an $n^+$ type impurity region that is formed using ion implantation. Therefore, the protecting element 200 is constituted by a part of the load resistor R1, the peripheral conduction region 51 near the first ground terminal pad G1, and the insulating region 203, which is a part of the GaAs substrate. With this arrangement, the protecting element 200 can be connected between the point CP and the ground terminal GND.

Figure 18:
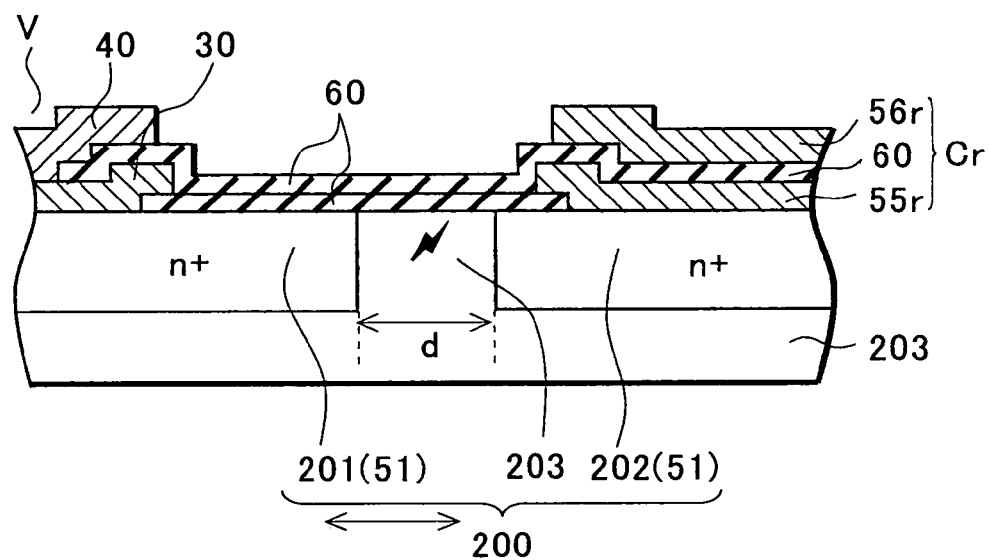
FIG. 18 is a cross-sectional view for explaining the fourth embodiment of the present invention.

In addition, as shown in FIG. 18, the protecting element 200 is also constituted by the peripheral conduction regions 51, located near a power supply terminal pad V and a lower electrode 55r of capacitor Cr respectively, and by a part of the GaAs substrate 203. With this arrangement, the protecting element 200 can be connected between a power supply terminal $V_{DD}$ and the ground terminal GND.

Figure 19:
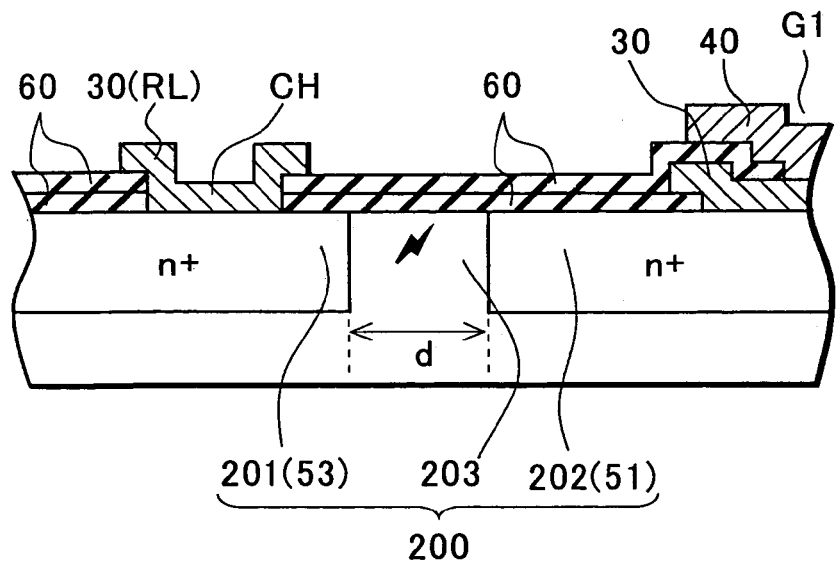
FIG. 19 is a cross-sectional view for explaining the fourth embodiment.

When a GaAs MESFET is employed for the third embodiment, as shown in FIG. 19, an n$^+$ type impurity region 53, which is connected to an inverted signal line RL using a direct current connection, is formed using ion implantation. The n$^+$ type impurity region 53 can be simultaneously formed together with the source region 137s and the drain region 137d. Then, the protecting element 200 can be constituted by the n$^+$ type impurity region 53, the peripheral conduction region 51 near the first ground terminal pad G1, and the insulating region 203 that is a part of the GaAs substrate. With this arrangement, the protecting element 200 can be connected between the point CP and the ground terminal GND.

To obtain the above described conduction regions, an epitaxial layer having a predetermined impurity concentration may be grown on an undoped GaAs substrate, and may be isolated by using an insulating region which is formed by boron, hydrogen or oxygen ion implantation.

The DPDT switching MMIC including a logic circuit has been explained as an example of the switching circuit device. However, the configuration of the switching circuit device is not limited to the above example, and a switching circuit device, such as an SP3T, an SP4T, a DP4T and a DP7T, where number of input port or number of output port is different from the DPDT may be employed. Furthermore, a shunt FET that prevents the leakage of a high frequency signal may be connected to the off-side output terminal.

According to the embodiments, since the protecting element is connected to the logic circuit of the switching MMIC, the logic circuit can be protected from electrostatic breakdown.

Further, according to the individual embodiments of the invention, by employing the components required for the logic circuit, the protecting element can be connected between the control terminal Ctl and the ground terminal GND, between the inverted signal line and the ground terminal GND, and between the power supply terminal $V_{DD}$ and the ground terminal GND. Therefore, the logic circuit can be completely protected from electrostatic breakdown, without having to form an additional, new element, such as a p type impurity region, for a protecting element.

Furthermore, since the conduction regions near the pads can be employed, the protecting element can be formed in the unused spaces between the pads. Therefore, special space for arranging the protecting element is not required, and the size of a chip can be reduced.

The protecting element is a device wherein an insulating region is arranged between the conduction regions, and since the parasitic capacitance of this device seldom occurs, the switching speed of the switching MMIC is not reduced.

What is claimed is:

1. A switching circuit device, comprising:
a compound semiconductor substrate;
a first switching portion formed on the substrate and receiving a first control signal;
a second switching portion formed on the substrate and receiving a second control signal that is a reversal of the first control signal;
a logic circuit formed on the substrate and comprising an inverter connected with a power supply terminal, a control terminal and a ground terminal, the logic circuit receiving the first control signal through the control terminal, inverting the first control signal using the inverter to produce the second control signal, supplying the first control signal to the first switching portion and supplying the second control signal to the second switching portion; and
a protecting element formed on the substrate and connected between the control terminal and the ground terminal, the protecting element comprising a first conduction region, a second conduction region and an insulating region that is disposed between the first and second conduction regions so as to provide a current path for surge protection,
wherein the logic circuit further comprises a capacitor comprising an upper electrode and a lower electrode that is formed on the substrate, and the first conduction region is disposed adjacent the lower electrode so that a direct current flows between the lower electrode and the first conduction region.

2. The switching circuit device of claim 1, further comprising a power supply terminal pad formed on the substrate and connected with the power supply terminal, wherein the second conduction region is disposed adjacent the power supply terminal pad so that a direct current flows between the power supply pad and the second conduction region.

3. The switching circuit device of claim 1, further comprising a ground terminal pad formed on the substrate and connected with the ground terminal, wherein the lower electrode is connected with the ground terminal pad.

4. The switching circuit device of claim 1, wherein the lower electrode extends across a surface of the substrate.

5. A switching circuit device, comprising:
a compound semiconductor substrate;
a first switching portion formed on the substrate and receiving a first control signal;
a second switching portion formed on the substrate and receiving a second control signal that is a reversal of the first control signal;
a logic circuit formed on the substrate and comprising an inverter connected with a power supply terminal, a control terminal and a ground terminal, the logic circuit receiving the first control signal through the control terminal, inverting the first control signal using the inverter to produce the second control signal, supplying the first control signal to the first switching portion and supplying the second control signal to the second switching portion;
a protecting element formed on the substrate and connected between the control terminal and the ground terminal, the protecting element comprising a first conduction region, a second conduction region and an insulating region that is disposed between the first and second conduction regions so as to provide a current path for surge protection;
an inverted signal line that is connected with the inverter at a junction point and supplies the second control signal to the second switching portion; and
another protecting element formed on the substrate and connected between the junction point and the ground terminal, the another protecting element comprising a first conduction region, a second conduction region and an insulating region that is disposed between the first and second conduction regions so as to provide a current path for surge protection, wherein the inverter comprises an enhancement type field effect transistor and a load resistor that is placed at the junction point, and one of the first conduction regions is part of the load resistor.

6. The switching circuit device of claim 5, further comprising a ground terminal pad formed on the substrate and connected with the ground terminal, wherein a second conduction region corresponding to the one of the first conduction regions is disposed adjacent the ground terminal pad so that a direct current flows between the ground terminal pad and the corresponding second conduction region.

* * * * *